(12) United States Patent
Whitlock

(10) Patent No.: US 9,958,490 B2
(45) Date of Patent: May 1, 2018

(54) ELECTRICAL MONITORING SYSTEM AND ASSEMBLY

(71) Applicant: THE BOEING COMPANY, Chicago, IL (US)

(72) Inventor: Neal D. Whitlock, Seattle, WA (US)

(73) Assignee: The Boeing Company, Chicago, IL (US)

( * ) Notice: Subject to any disclaimer, the term of this patent is extended or adjusted under 35 U.S.C. 154(b) by 215 days.

(21) Appl. No.: 14/686,889

(22) Filed: Apr. 15, 2015

(65) Prior Publication Data

US 2016/0306000 A1 Oct. 20, 2016

(51) Int. Cl.
| | |
|---|---|
| *G01R 31/00* | (2006.01) |
| *G01R 31/04* | (2006.01) |
| *H05K 9/00* | (2006.01) |
| *G01R 27/28* | (2006.01) |
| *G01R 31/11* | (2006.01) |

(52) U.S. Cl.
CPC ........... *G01R 31/008* (2013.01); *G01R 31/04* (2013.01); *H05K 9/0069* (2013.01); *G01R 27/28* (2013.01); *G01R 31/11* (2013.01)

(58) Field of Classification Search
CPC ...... G01R 31/008; G01R 31/08; G01R 31/11; G01R 27/02; G01R 27/28
USPC ................ 324/503, 525, 532, 533, 534, 535
See application file for complete search history.

(56) References Cited

U.S. PATENT DOCUMENTS

| | | | |
|---|---|---|---|
| 5,378,992 A | 1/1995 | Murphy | |
| 5,479,610 A * | 12/1995 | Roll-Mecak | G01R 31/11 324/534 |
| 5,861,882 A * | 1/1999 | Sprenger | |
| 6,177,801 B1 * | 1/2001 | Chong | |
| 6,225,810 B1 | 5/2001 | Godo | |
| 7,071,700 B2 * | 7/2006 | Gorka | 324/534 |
| 7,368,919 B2 * | 5/2008 | Gervais | G01R 31/021 324/503 |
| 7,977,949 B2 | 7/2011 | Williams | |

FOREIGN PATENT DOCUMENTS

EP 2385382 11/2011

* cited by examiner

*Primary Examiner* — Walter L Lindsay, Jr.
*Assistant Examiner* — Milton Gonzalez
(74) *Attorney, Agent, or Firm* — Joseph M. Butscher; The Small Patent Law Group, LLC

(57) ABSTRACT

An electrical monitoring system is configured to monitor one or more systems of a vehicle. The electrical monitoring system may include a housing, a loop resistance test (LRT) unit contained within the housing, a network analyzer unit contained with the housing, and a time domain reflectometer (TDR) unit contained within the housing. The LRT unit is configured to conduct loop resistance tests with respect to the system(s) of the vehicle. The network analyzer unit is configured to conduct network analysis with respect to the system(s) of the vehicle. The TDR unit is configured to conduct time domain reflectometry with respect to the system(s) of the vehicle.

20 Claims, 5 Drawing Sheets

ELECTRICAL MONITORING SYSTEM AND ASSEMBLY

FIELD OF EMBODIMENTS OF THE DISCLOSURE

Embodiments of the present disclosure generally relate to electrical testing and/or monitoring systems, methods, and assemblies.

BACKGROUND OF THE DISCLOSURE

In aircraft, cable shields are used to protect various aircraft systems from electrical effects, such as lightning strikes, high intensity radiated fields, and other environmental conditions. A loop resistance tester may be used to test the cable shields and joints in aircraft systems. In general, a cable shield includes material that covers a number of wires in a cable. A cable shield may protect the wire(s) from physical contact and/or from interference caused by electromagnetic fields or signals. A joint is a connection in which a cable may be connected to another cable and/or device. A loop resistance tester is an electronic instrument or device that is used to measure the resistance of cable shields and joints.

Typically, a loop resistance tester contains couplers, joint probes, and an instrument assembly. The couplers are used to measure a loop resistance formed by the shielding in the cable under test and the aircraft structure. The joint probes are used to measure the resistance of joints in the cable to ensure measured values are within designed tolerance and to compare the sum of joint impedances to the loop measurement, which includes all of the individual joints within the loop.

Many known loop resistance testers are bulky and heavy. For example, a known loop resistance tester weighs in excess of thirty pounds. Further, known loop resistance testers are limited to particular pre-programmed functions, and are often difficult to update. Also, modifications to known loop resistance testers are costly.

Accordingly, a need exists for an adaptable, efficient, and cost-effective system and method for testing and troubleshooting in relation to components.

SUMMARY OF EMBODIMENTS OF THE DISCLOSURE

Certain embodiments of the present disclosure provide an electrical monitoring system configured to monitor one or more systems of a vehicle. The electrical monitoring system may include a housing that may contain a plurality of components that are configured to exercise a range of functions. For example, the electrical monitoring system may include a loop resistance test (LRT) unit contained within the housing, and a network analyzer unit contained within the housing. The LRT unit is configured to conduct loop resistance tests with respect to the system(s) of the vehicle. The network analyzer unit is configured to conduct network analysis with respect to the system(s) of the vehicle.

The electrical monitoring system may include one or more LRT ports extending into or from the housing. The LRT port(s) may be coupled to the LRT unit and configured to connect to the system(s) of the vehicle. In at least one embodiment, the LRT port(s) may be utilized to exercise loop resistance test functions by directly connecting to a drive coupler, sense coupler, and joint probes. Alternatively, the drive coupler, sense coupler, and joint probes may be connected to a wireless coupler module, capable of communicating with the electrical monitoring system or a software interface package on a wifi enabled laptop computer configured to evaluate the systems(s) of the vehicle. Additionally, one or more network analyzer ports may extend into or from the housing. The network analyzer port(s) may be coupled to the network analyzer unit and configured to connect to the system(s) of the vehicle. In at least one embodiment, the LRT ports include a sense coupler, a drive coupler, and at least one joint probe. The LRT port(s) may be incompatible with the network analyzer unit, and wherein the network analyzer port(s) may be incompatible with the LRT unit.

The electrical monitoring system may also include a time domain reflectometer (TDR) unit contained within the housing. The TDR unit is configured to conduct time domain reflectometry with respect to the one or more systems of the vehicle. The TDR may be configured to evaluate characteristics of electrical lines of systems of the vehicle through time domain reflectometry. One or more TDR ports may extend into or from the housing. The TDR port(s) may be coupled to the TDR unit and configured to connect to the one or more systems of the vehicle. The TDR port(s) may be incompatible with the LRT unit and the network analyzer unit.

The electrical monitoring system may also include a communication unit configured to allow communication between the electrical monitoring system and a remote computing device. The remote computing device is configured to process data obtained by one or both of the LRT unit and the network analyzer unit. The units contained with the housing may receive software updates from the remote computing device through the communication unit.

In at least one embodiment, the housing may include a plurality of docks configured to removably retain a plurality of unit modules. The plurality of unit modules may include an LRT unit module that includes the LRT unit and a network analyzer unit module that includes the network analyzer unit, for example.

In at least one embodiment, the housing provides a display that is configured to present information related to the loop resistance tests and the network analysis, for example. The display may also be configured to present information related to time domain reflectometry. Additionally, or alternatively, a wireless coupler module may include a display that is configured to display at least a portion of test results.

Certain embodiments of the present disclosure provide a method of monitoring one or more systems of a vehicle. The method may include connecting one or more loop resistance test (LRT) ports of a single handheld monitoring system to the system(s), conducting a LRT of the system(s) with the single handheld monitoring system, disconnecting the one or more LRT ports of the single handheld monitoring system from the system(s), connecting one or more network analysis ports of the single handheld monitoring system to the system(s), conducting a network analysis of the system(s) with the single handheld monitoring system, disconnecting the one or more network analysis ports of the single handheld monitoring system from the system(s), connecting one or more time domain reflectometer (TDR) ports of the single handheld monitoring system to the system(s), conducting time domain reflectometry of the system(s) with the single handheld monitoring system, and disconnecting the one or more TDR ports of the single handheld monitoring system from the system(s). The method may also include wirelessly transmitting data related to the LRT, the network analysis, and the time domain reflectometry from the single handheld system to a separate and distinct computing device. The method may also include processing the data with the separate and distinct computing device. Further, the method may include transmitting software updates from the separate and computing device to the single handheld monitoring system.

DETAILED DESCRIPTION OF THE DISCLOSURE

The foregoing summary, as well as the following detailed description of certain embodiments will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Certain embodiments of the present disclosure provide an electrical monitoring system configured for use with aircraft. Alternatively, the electrical monitoring system may be used with a range of applications other than aircraft in which it is desirable to isolate specific joint resistance interfaces within parallel resistive networks in addition to overall loop resistance measurements. The system may be software based, in contrast to prior loop resistance testers that are typically firmware based. The electrical monitoring system may include a housing that includes a loop resistance test unit, a network analyzer, and/or a time domain reflectometer. Because the electrical monitoring system may be software based, a user may select desired features and aspects, which may be periodically updated through wireless communication, such as Wi-Fi.

Unlike prior testing devices that utilize one or more mathematical models and estimates to generate a resistance measurement, embodiments of the present disclosure provide an electrical monitoring system that is configured to acquire real data (for example, resistance and reactance), thereby providing enhanced electrical parameters.

Certain embodiments of the present disclosure provide an electrical monitoring system for shielded wire in which the shield is connected to a conducting structure or itself such that a closed electrical current loop is formed. The electrical monitoring system may include a test alternating current (AC) signal generator coupled to the loop using a magnetic coupler, a test, or sense winding positioned on the coupler and configured to measure an induced loop voltage, a receiving circuit to measure the induced loop current, and a network analyzer to perform frequency sweep measurements of the cable shield. The system may also include a wireless transceiver to enable the unit to transmit and receive information to or from a remote location. The system may also include a time domain reflectometer (TDR).

Figure 1:
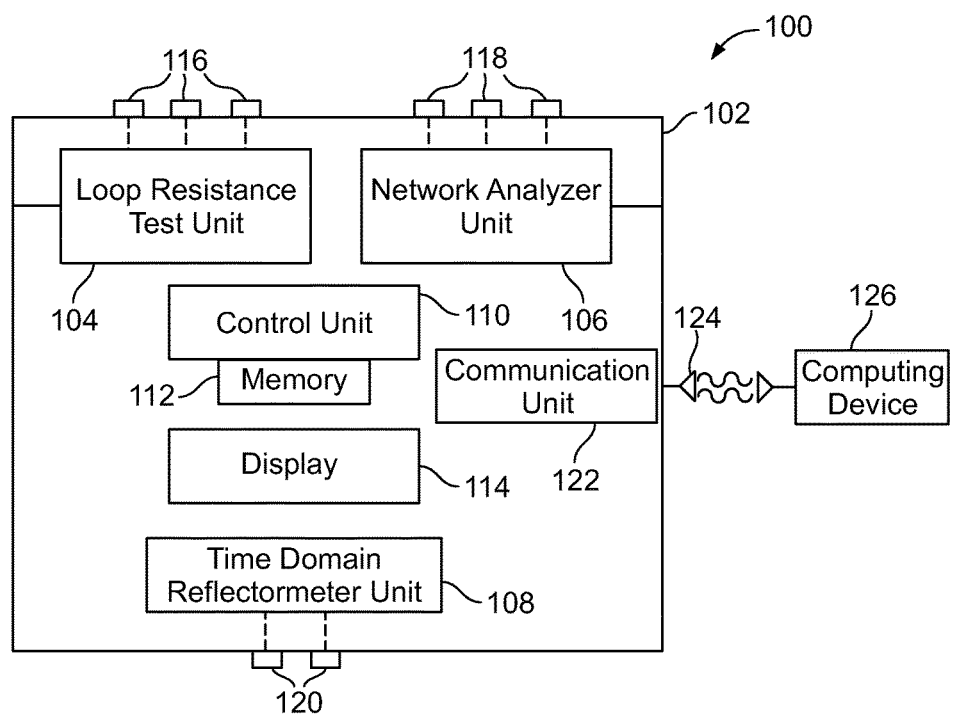
FIG. 1 illustrates a schematic block diagram of an electrical monitoring system, according to an embodiment of the present disclosure.

FIG. 1 illustrates a schematic block diagram of an electrical monitoring system 100, according to an embodiment of the present disclosure. The electrical monitoring system 100 may include a housing 102 that contains a loop resistance test (LRT) unit 104, a network analyzer 106, and a time domain reflectometer (TDR) unit 108. Notably, the single housing 102 contains each of the LRT unit 104, the network analyzer, and the TDR unit 108. Accordingly, the unitary monitoring system 100 may be used to perform a loop resistance test with the LRT unit 104. The data from the LRT unit 104 may then be used by the network analyzer 106 to identify electrical characteristics of a system being analyzed (such a cable shields and joints within an aircraft) for enhanced analysis, and the TDR unit 108 may be used to determine a location of any malfunction within the system being analyzed.

The electrical monitoring system 100 may also include a central control unit 110 that is in communication with each of the LRT unit 104, the network analyzer 106, and the TDR unit 108. The central control unit 110 may include or otherwise be in communication with a memory 112 that stores instructions for operation of the electrical monitoring system 100. The control unit 110 may be configured to coordinate and control operation of the electrical monitoring system 100. Alternatively, the electrical monitoring system 100 may not include the control unit 110.

A display 114 may be operatively coupled to the control unit 110. The display 114 is configured to (display status, commands, options, and the like for the electrical monitoring system 100. For example, the display 114 may be one or more of a digital display, liquid crystal display, light emitting diode display, plasma display, or other such monitor. In at least one embodiment, the display 114 may be a touchscreen display that allows an individual to input commands therethrough. Optionally, the electrical monitoring system 100 may include a separate interface, such as buttons, a keyboard, switches, and/or the like, that allow an individual to input commands into the electrical monitoring system. An individual may input commands into the electrical monitoring system 100 to initiate a loop resistance test with the LRT unit 104, analyze results of the loop resistance test with the network analyzer 106, and/or determine a location of potentially malfunctioning components through use of the TDR unit 108.

Alternatively, the electrical monitoring system 100 may not include the display 114. Instead, data obtained by the units 104, 106, and 108 may be wirelessly transmitted to a remote or otherwise separate computing device 126 (such as a laptop computer, handheld smart phone, tablet, or the like), which may process the data and show information related to the obtained data through a display.

The LRT unit 104 may be operatively coupled to a plurality of LRT ports 116 that are configured for use with a loop resistance test. For example, the LRT ports 116 may include a sense coupler, a drive coupler, and joint probes. The LRT ports 116 may be configured for operation at a particular LRT frequency or range of frequencies, such as 200 Hz, for example. The LRT ports 116 may include more or less ports than shown.

The network analyzer unit 106 may be operatively coupled to a plurality of network analyzer ports 118, which are configured for network analysis. For example, the network analyzer ports 118 may differ from the LRT ports 116, and may be incompatible with the LRT unit 104 (and the LRT ports 116 may be incompatible with the network analyzer unit 106). In at least one embodiment, the different units may be compatible with different sized ports. The frequencies of for each function (such as LRT, TDR, etc.) may determine the type of couplers used. In at least one embodiment, the network analyzer ports 118 may be configured for operation at a particular network analysis frequency or range of frequencies, such as a direct current (DC) frequency, or a frequency within the range of 1-90 GHz, for example. The network analyzer ports 118 may include more or less ports than shown.

The TDR unit 108 may be operatively coupled to a plurality of TDR ports 120 that are configured for use with a TDR process. For example, the TDR ports differ from the LRT ports 116 and the network analyzer ports 118. The TDR ports 120 may be incompatible with the LRT unit 104 and the network analyzer unit 106. The TDR ports 120 may include more or less ports than shown.

Alternatively, the ports 116, 118, and 120 may be interchangeable and be configured for use with any of the units. In at least one embodiment, each of the ports may include multiple input terminals that may be specifically configured for coupling with a particular unit. For example, each port may include three coaxial wire terminals, each of which may be compatible with a particular unit.

The LRT unit 104, the network analyzer unit 106, and the TDR unit 108, in one embodiment, form part of a single monitoring circuit that may be in communication with the control unit 110. In at least one embodiment, the single monitoring circuit may also include the control unit 110. Optionally, each of the of the LRT unit 104, the network analyzer unit 106, and the TDR unit 108 may be a separate and distinct circuit that is configured to communicate with the control unit 110 through one or more wired or wireless connections.

The electrical monitoring system 100 may include a communication unit 122, which may include one or more antennas 124. The communication unit 122 may be, for example, a WiFi unit that is configured to wirelessly transmit and receive signals from another device. For example, the communication unit 122 may be configured to communicate with a separate, distinct, and remote computing device 126, such as a laptop computer, a smart phone, an electronic tablet, and/or the like, in order to transmit monitoring data and/or signals therebetween. Further, software updates for each of the LRT unit 104, the network analyzer 106, and the TDR unit 108 may be received and downloaded through the communication unit 122. For example, the remote computing device 126 may be used to update software that controls operation of each of the LRT unit 104, the network analyzer unit 106, and the TDR unit 108.

Processing of data from the various units 104, 106, and 108 may be performed in the remote computing device 126. As such, the housing 102 may include additional internal space that may be used by the units 104, 106, 108, and/or additional units, upgrades, and the like. Further, because processing structures may be located in the remote computing device 126, the housing 102 may be smaller and more compact, as there is no need to include such processing structures within the housing 102. Accordingly, embodiments of the present disclosure expand product features, provide a compact assembly (such as a handheld device), and create opportunities for future upgrades instead of replacement.

Coupling the electrical monitoring system 100 with the remote computing device 126 (such as through wireless communication) expands the possibilities and features of the electrical monitoring system 100. In contrast to prior known loop resistance testers, which are relatively expensive and limited to just loop resistance testing functionality, embodiments of the present disclosure are more compact, efficient, less costly, and provide additional functionality (such as network analysis, time domain reflectometry, etc.).

The housing 102 provides a compact, unitary structure that houses and integrates each of the LRT unit 104, the network analyzer 106, and the TDR unit 108 therein. The housing 102 provides the electrical monitoring system 100 with a single, efficient package that allows an individual to perform a loop resistance test using the LRT unit 104, analyze a system with the network analyzer 106, and determine a location of a potential malfunction with the TDR unit 108. In short, the individual does not need to utilize three separate and distinct devices to perform such functions. Therefore, the electrical monitoring system provides an efficient and cost effective system and method of performing various functions. In at least one embodiment the housing 102 may provide a structure that may be held in a hand.

The housing 102 contains the functionality of LRT, network analysis, and TDR. In at least one embodiment, the LRT, network analysis, and TDR may be controlled by a single processor with supporting circuitry for each function.

In operation, an individual connects the LRT ports 116 to reciprocal structures within a system to be tested. Once the LRT ports 116 are connected to the reciprocal structures, the display 114 may prompt the individual to initiate one or more loop resistance tests. The LRT ports 116 may include couplers and joint probes. For example, the couplers may be used to measure a loop resistance formed by cable shielding and a structure, such as an aircraft. The joint probes may be used to measure resistance of joints in cables, for example, to ensure that measured values are within designated tolerances. The results of the loop resistance test may be analyzed by the control unit 110, stored in memory 112, and/or transmitted to the computing device 126, which may analyze the loop resistance test results. The loop resistance test results may include actual resistance and/or reactance values.

Once the loop resistance test is completed, the LRT ports 116 may be decoupled from the system being analyzed. The network analyzer unit 106 may then be coupled to the system being analyzed through the network analyzer ports 118. The actual results of the loop resistance test may be used in conjunction with operation of the network analyzer 106. Instead of using a separate and distinct system to perform a network analysis, the electrical monitoring system 100 may use the integral network analyzer unit 106.

The network analyzer unit 106 is configured to measure network parameters of electrical networks, such as within a system being analyzed (for example, an aircraft). For example, in at least one embodiment, the network analyzer unit 106 may measure s-parameters, y-parameters, z-parameters, and h-parameters, and the like. The network analyzer unit 106 may be configured to analyze or sweep an entire system to be monitored across a range of frequencies. The system being monitored may react differently to different frequencies. The network analyzer unit 106 may be used to troubleshoot, for example. The network analyzer unit 106 may analyze and output real time data, instead of averages, thereby improving an ability to identify specific failures modes. For example, failure of some components may affect low frequencies, while failure of other components may affect high frequencies.

The TDR unit 108 may operate through time-domain reflectometry to characterize and locate faults in cables, for example. The TDR unit 108 may be used to locate discontinuities in a connector, printed circuit board, or any other electrical path, for example.

Each of the LRT unit 104, the network analyzer 106, and the TDR unit 108 may be used in conjunction with each other, or isolated from each other. For example, a user may utilize the network analyzer 106 without using either of the LRT unit 104 or the TDR unit 108. Similarly, the user may utilize the TDR unit 108 without utilizing either of the LRT unit 104 or the network analyzer 106.

As noted, the control unit 110 may be used to control, monitor, and analyze data output from and input into each of the LRT unit 104, the network analyzer 106, and the TDR unit 108. Optionally, the remote computing device 126 may be used to control and coordinate operation of the LRT unit 104, the network analyzer 106, and the TDR unit 108.

Alternatively, the electrical monitoring system 100 may not include the TDR unit 108. Instead, the electrical monitoring system 100 may include the LRT unit 104 and the network analyzer 106. In at least one other embodiment, the electrical monitoring system 100 may not include the network analyzer 106. Instead, the electrical monitoring system 100 may include the LRT unit 104 and the TDR unit 108.

While not shown in FIG. 1, the electrical monitoring system 100 may include one or more input ports, receptacles, and/or the like that are configured to selectively couple to one or more devices, modules, or the like that are configured to provide additional functionality. As such, the electrical monitoring system 100 may be adaptable and configured to interchangeably connect to and disconnect from various other functional modules.

The control unit 110, and/or the units 104, 106, and 108, may be or include a central processing unit (CPU), which may be in communication with or otherwise include, a memory that stores programs, instructions, and the like that govern operation of the transducer. In short, each of the units may be or include a circuit that includes one or more processors (such as microprocessors, microcontrollers, etc.), one or more memories, and/or the like that are configured to control the electrical monitoring system 100.

As used herein, the term "unit," "control unit," "central processing unit," "CPU," "computer," or the like may include any processor-based or microprocessor-based system including systems using microcontrollers, reduced instruction set computers (RISC), application specific integrated circuits (ASICs), logic circuits, and any other circuit or processor capable of executing the functions described herein. Such are exemplary only, and are thus not intended to limit in any way the definition and/or meaning of such terms.

The computer or processor executes a set of instructions that are stored in one or more storage elements (such as one or more memories), in order to process data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the subject matter described herein. The set of instructions may be in the form of a software program. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to user commands, or in response to results of previous processing, or in response to a request made by another processing machine.

As noted, the software stored in the memory 112 or within memories of any of the units 104, 106, and 108, may be updated by the remote computing device 126. For example, the computing device 126 may send updates to the various units through the communication unit 122.

The diagrams of embodiments herein may illustrate one or more control or processing units or modules. It is to be understood that the processing or control units or modules represent circuit modules that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hardwired to perform the functions described herein. Optionally, the hardware may include electronic circuits that include and/or are connected to one or more logic-based devices, such as microprocessors, processors, controllers, or the like. Optionally, the control units or modules may represent processing circuitry such as one or more of a field programmable gate array (FPGA), application specific integrated circuit (ASIC), microprocessor(s), a quantum computing device, and/or the like. The circuits in various embodiments may be configured to execute one or more algorithms to perform functions described herein. The one or more algorithms may include aspects of embodiments disclosed herein, whether or not expressly identified in a flowchart or a method.

As used herein, the term "software" may include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

Figure 2:
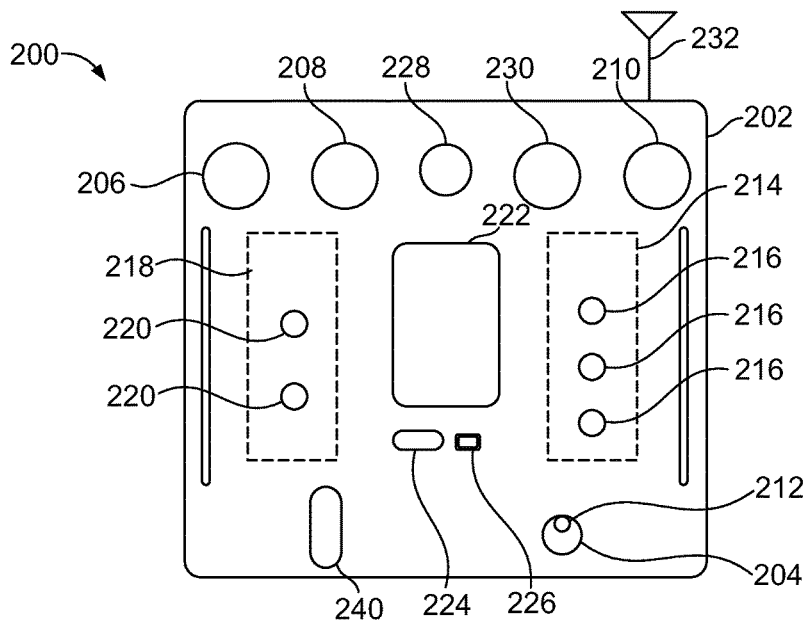
FIG. 2 illustrates a schematic block diagram of an electrical monitoring system, according to an embodiment of the present disclosure.

FIG. 2 illustrates a schematic block diagram of an electrical monitoring system 200, according to an embodiment of the present disclosure. The electrical monitoring system 200 is similar to the electrical monitoring system 100 described with respect to FIG. 1. The electrical monitoring system 200 includes a housing 202 that contains an LRT unit 204 operatively coupled to LRT ports including a sense coupler 206, a drive coupler 208, and joint probes 210. The LRT unit 204 may also include a mode switch 212 that is configured to allow a user to switch between LRT modes, such as a loop test mode and a joint test mode.

The housing 202 also contains a network analyzer unit 214 that may include a plurality of network ports 216 and a TDR unit 218 that may include a plurality of TDR ports 220.

The housing 202 may also retain a display 222, a communication unit 224 (such as a WiFi unit), a universal serial bus (USB) port 226, and an additional port 228, such as an RS-232 port that is used with respect to the LRT unit 204, for example. An antenna 232 may be coupled to the housing 202 and in communication with the communication unit 224. The antenna 232 is configured to allow signals to be transmitted between the communication module 224 and a remote computing device, for example. In this manner, the remote computing device may be used to update software of the various units of the system.

A charging input port 230 may also be located on the housing 202. The charging input port 230 may be configured to selectively connect to and disconnect from a power source that is configured to charge an internal battery within the housing 202 that is configured to provide power to operate the system 200.

An operational status indicator 240, such as a digital, LED, LCD, or the like display structure, may be retained by the housing 202. The operational status indicator 240 may be used to indicate a current operational status of the system 200. For example, the operational status indicator 240 may indicate a red light for an off/charging state, and a green light when the system 200 is operating or running.

The system 200 provides a single, compact, efficient housing 202 that retains, contains, or otherwise secures each of the LRT unit 204, the network analyzer 214, and the TDR unit 218. As such, the system 200 provides a single assembly, which may be a handheld device, which is configured to perform a loop resistance test, network analysis, and time domain reflectometry.

Figure 3:
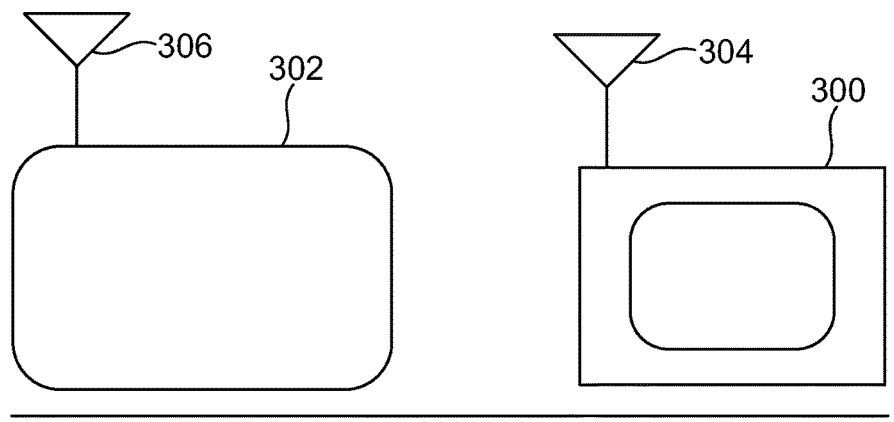
FIG. 3 illustrates a simplified schematic block diagram of an electrical monitoring system in communication with a remote computing device, according to an embodiment of the present disclosure.

FIG. 3 illustrates a simplified schematic block diagram of an electrical monitoring system 300 in communication with a remote computing device 302 (such as a laptop computer), according to an embodiment of the present disclosure. The electrical monitoring system 300 may be any of those described in the present application, such as the electrical monitoring systems 100 or 200. As noted, the electrical monitoring system 300 may include one or more transceivers or antennas 304, while the computing device 302 may include one or more transceivers or antennas 306. The electrical monitoring system 300 and the computing device 302 may transmit and receive signals through the respective transceivers or antennas 304 and 306.

The computing device 302 may wirelessly update software within the electrical monitoring system 300. For example, the computing device 302 may send software updates to the various units of the electrical monitoring system 300, which may download the software updates and operate the various units based on the updates.

Alternatively, the electrical monitoring system 300 may not be configured to wirelessly communicate with the computing device 302. Also, alternatively, a software-based systems and method may mimic basic LRT functionality and transmit results from the monitoring system directly to software within a computing device, which may be independent of the monitoring system.

Figure 4:
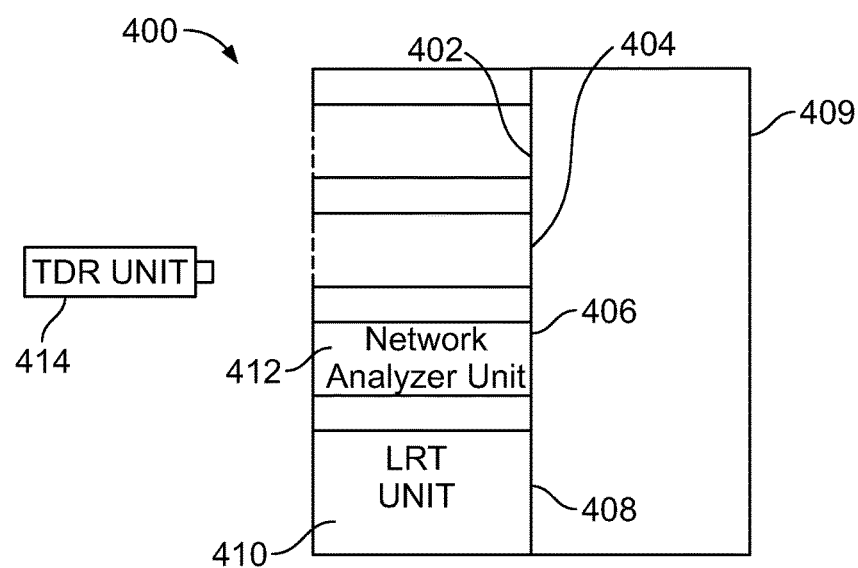
FIG. 4 illustrates a simplified schematic block diagram of an electrical monitoring system, according to an embodiment of the present disclosure.

FIG. 4 illustrates a simplified schematic block diagram of an electrical monitoring system 400, according to an embodiment of the present disclosure. The system 400 is similar to those described in the present application, such as the systems 100, 200, and 300. The system 400 includes a plurality of modules that are configured to be selectively connected and disconnected from receptacle docks 402, 404, 406, and 408 within a housing 409. Each module may be a self-contained plug-in assembly that contains circuitry configured to perform one or more functions. For example, an LRT unit module 410 may be connected to the dock 408, a network analyzer unit module 412 may be connected to the dock 406, a TDR unit module 414 may be configured to be inserted into the dock 404. Each of the modules may be plugged into and removed from a respective dock. The dock 402 may be open and configured to receive an additional testing module that differs from the modules 410, 412, and 414. Accordingly, the system 400 may be adaptable and configured to provide additional operational capability.

The modules may be interchangeably connected to the housing 409. For example, the system 400 may swap the network analyzer unit module 412 with a different module. More or less modules and docks than shown may be used.

Figure 5:
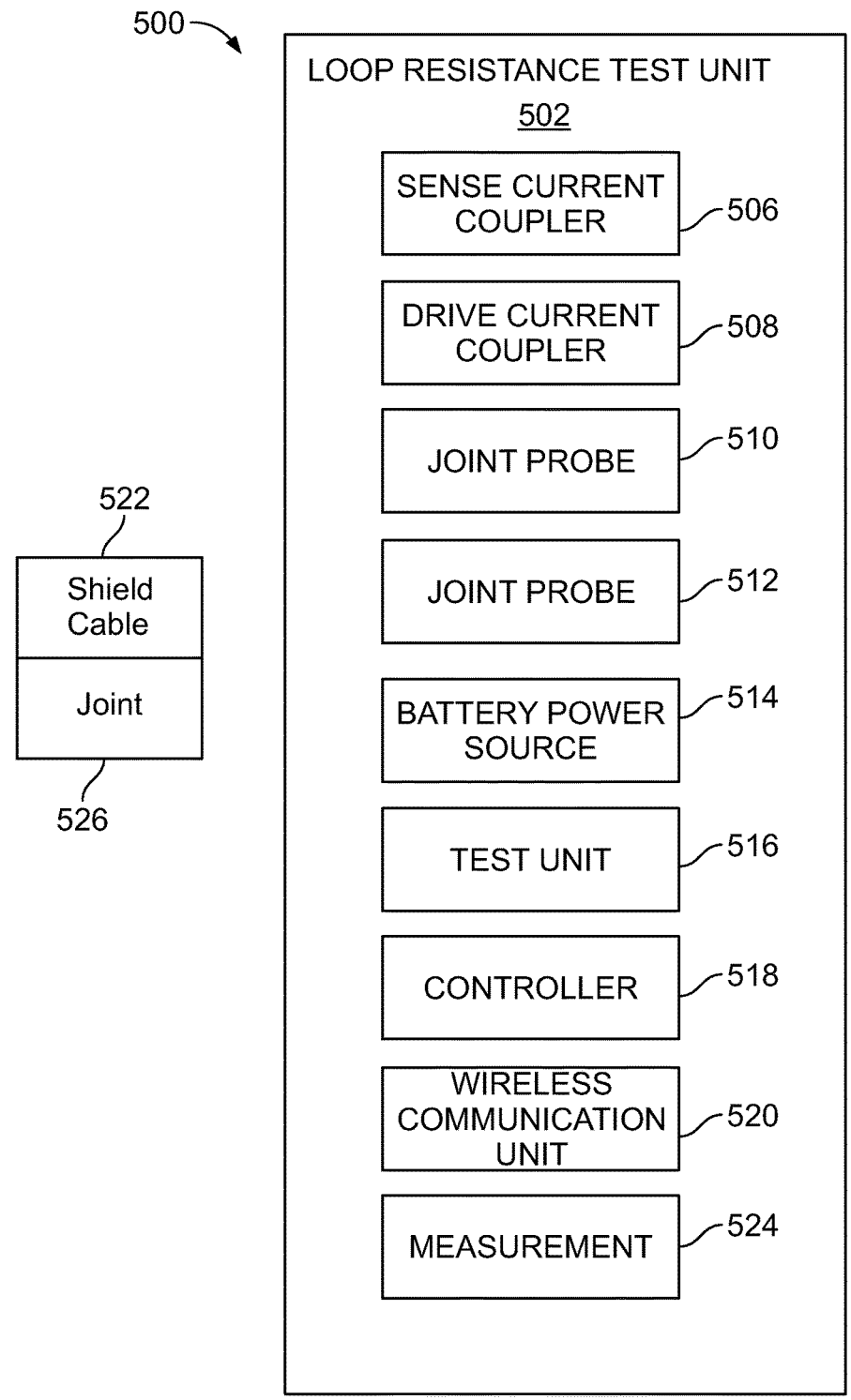
FIG. 5 illustrates a schematic diagram of a loop resistance test system, according to an embodiment of the present disclosure.

FIG. 5 illustrates a schematic diagram of a LRT system 500, according to an embodiment of the present disclosure. The LRT system 500 may be used with any of the electrical monitoring systems described in the present application, such as the systems 100, 200, 300, and 400. The LRT system 500 may be used to perform loop resistance tests on various cables and joints within an electrical system of a vehicle, such as an aircraft, for example.

The LRT system 500 includes an LRT unit 502 (which may be used in conjunction with any of the systems 100, 200, 300, and 400, for example) that includes sense current coupler 506, drive coupler 508, joint probe 510, joint probe 512, battery power source 514, test unit 516, controller 518, and wireless communications unit 520. The test unit 516 may make two types of measurements in the illustrative examples. For example, the test unit 516 may measure the loop resistance when in a loop mode, and joint impedance when in a joint mode.

The sense current coupler 506 may be connected to a shielded cable 522 in one location and the drive coupler 508 may be connected to the shielded cable 522 in another location. The test unit 516 may send current across the shielded cable 522 from the drive coupler 508 to the sense current coupler 506.

The test unit 516 inductively applies a known current to a point at the shielded cable 522 where the drive coupler 508 is connected to the shielded cable 522. By driving a current through the drive coupler 508, the test unit 516 is able to induce or produce a current onto the shielded cable 522. The current travels through the shielded cable 522 to the point at which the sense current coupler 506 is connected to the shielded cable 522. The sense current coupler 506 measures the current applied to the shielded cable 522. The test unit 516 may generate resistance measurements from the couplers that are placed in measurements 524. The measurements 524 may be used to determine if the shielding in shielded cable 522 satisfies predetermined acceptance criteria without having to disconnect the shielded cable 522.

Further, the test unit 516 may also generate impedance measurements for joint 526 using joint probe 510 and joint probe 512. The joint probe 510 may be placed at one location on the joint 526 while the joint probe 512 may be placed at another location on the joint 526. The joint probes may be connected, while the sense current coupler 506 and the drive coupler 508 are attached to the shielded cable 522. The drive coupler 508 induces the drive voltage onto a bundle, creating a drive current. The resulting voltage drop across the joint 526 due to the drive current is measured, by which a resistance value is then derived as R=V/I, in which R is the resistance value, V is the voltage, and I is the current.

The test unit 516 measures the voltage drop across a joint using the joint probes 510 and 512. The measurements 524 are made using the joint probes 510 and 512 while current is being sent from the drive coupler 508 through the shielded cable 522 or other conductive elements, such as, for example, ground straps or jumpers.

The voltage measurements 524 made using the joint probes 510 and 512 with the current measured by the sense current coupler 506 may be used to obtain resistance in the joint 526. The use of the joint probes 510 and 512, in conjunction with the use of the sense current coupler 506, allow for the isolation of a single joint connection within a complex parallel network without having to remove or disconnect a cable. In other words, if the joint 526 has a faulty or out of tolerance connection (that is, a connection is broken or loose), the faulty connection may be identified without having to remove or disconnect the shielded cable 522.

In at least one embodiment, a loop mode measurement may be performed prior to a joint mode measurement. After a loop value has been measured, a joint mode may be selected with the sense current coupler 506 and the drive coupler 508 remaining attached to the shielded cable 522 and continuing to induce current onto the device being tested. In this mode, the joint probe 510 and the joint probe 512 may function as voltage probes. A measurement of voltage is made across the probes and divided by the induced current to obtain a resistance value.

The controller 518 may be used to control the test unit 516 based on commands received through the wireless communications unit 520. The commands may be received from a remote computing device, for example. Further, the controller 518 may send the measurements 524 to the remote computing device over the wireless communications unit 520. The wireless communications unit 520 may be, for example, a wireless transceiver, a wireless network card, a wireless RS-232 link, or some other suitable wireless device. Accordingly, the measurements 524 may not be stored local to the controller 518. Alternatively, the measurements 524 may be stored local to the controller 518. In addition, the measurements 524 may be analyzed by the remote computing device and stored or made ready for transmission if determined to be valid data.

Figure 6:
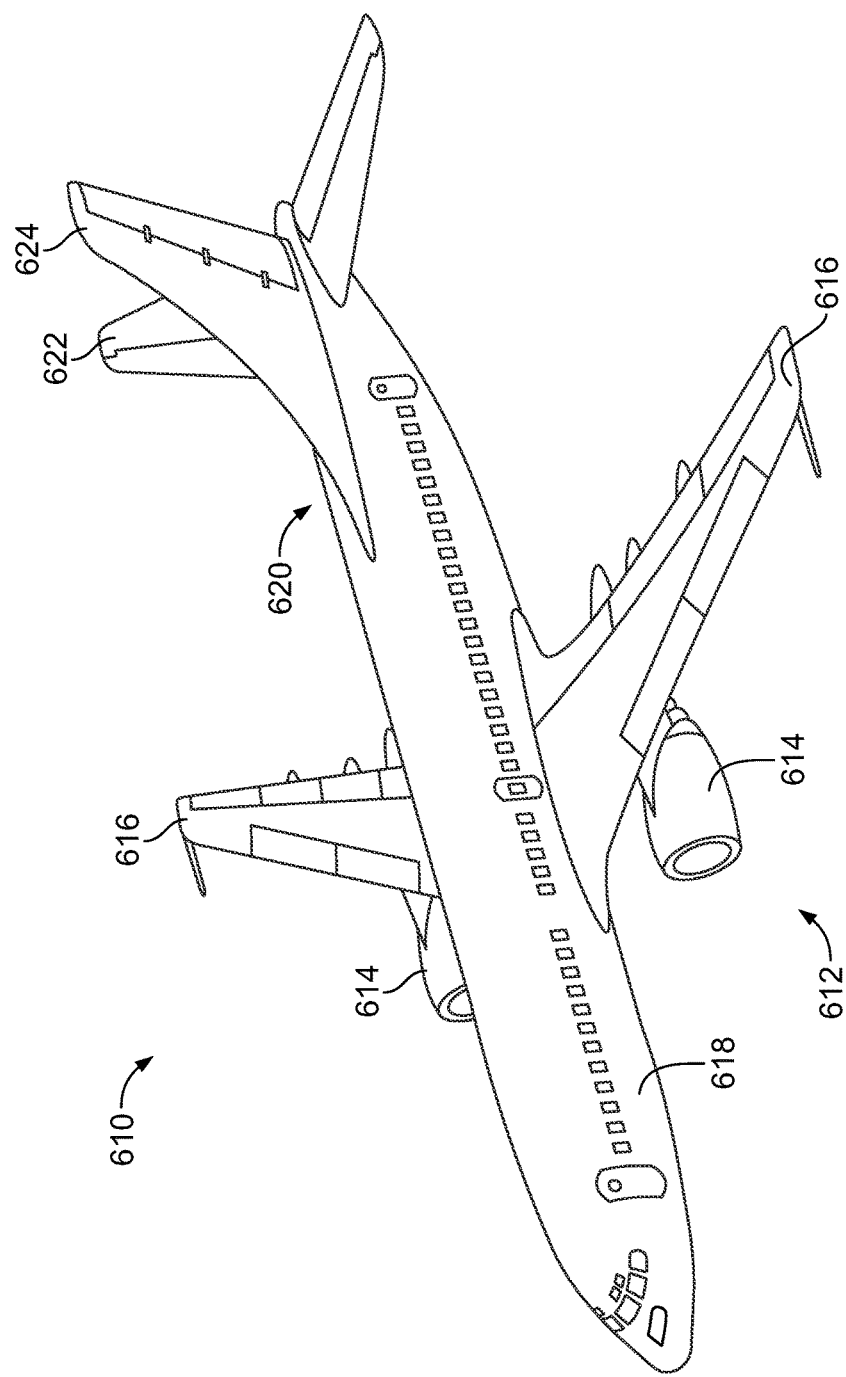
FIG. 6 illustrates a perspective top view of an aircraft, according to an embodiment of the present disclosure.

FIG. 6 illustrates a perspective top view of an aircraft 610 (or aircraft assembly), according to an embodiment of the present disclosure. The aircraft 610 is an example of a vehicle that may include various electrical systems that may be tested or otherwise monitored by an electrical monitoring system, such as any of the systems 100, 200, 300, or 400. Alternatively, instead of an aircraft, the systems and methods of embodiments of the present disclosure may be used with various other vehicles, such as automobiles, buses, locomotives and train cars, seacraft, spacecraft, and the like.

The aircraft 610 may include a propulsion system 612 that may include two turbofan engines 614, for example. Optionally, the propulsion system 612 may include more engines 614 than shown. The engines 614 are carried by wings 616 of the aircraft 610. In other embodiments, the engines 614 may be carried by a fuselage 618 and/or an empennage 620. The empennage 620 may also support horizontal stabilizers 622 and a vertical stabilizer 624.

Figure 7:
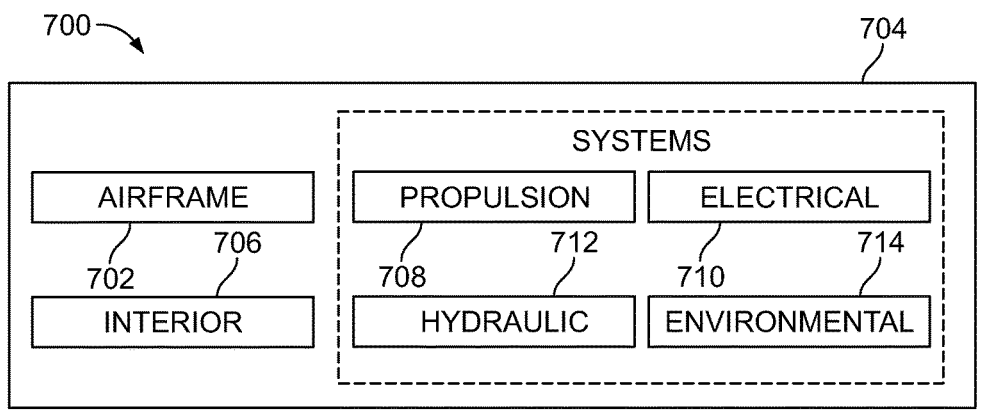
FIG. 7 illustrates a schematic block diagram of an aircraft, according to an embodiment of the present disclosure.

FIG. 7 illustrates a schematic block diagram of an aircraft 700, according to an embodiment of the present disclosure. The aircraft 700 is an example of a vehicle including a plurality of systems that may be tested or otherwise monitored with an electrical monitoring system, such as any of the systems 100, 200, 300, or 400. The aircraft 700 may include an airframe 702 with a plurality of systems 704 and interior 706. Examples of the systems 704 include one or more of a propulsion system 708, an electrical system 710, a hydraulic system 712, and an environmental system 714. Any number of other systems may be included. Although an aerospace example is shown, different advantageous embodiments may be applied to other industries, such as, for example, the automotive industry, where highly electrically conductive bonds are verified.

Referring to FIGS. 1-7, embodiments of the present disclosure provide electrical monitoring systems and methods that are contained in a compact, efficient housing. Certain electrical monitoring systems and methods allow for wireless data processing, and provide various functional units.

At least one embodiment of the present disclosure provides a method of monitoring one or more systems of a vehicle. The method may include connecting one or more loop resistance test (LRT) ports of a single handheld monitoring system (such as any of the systems 100, 200, 300, or 400) to the system(s), conducting a LRT of the system(s) with the single handheld monitoring system, disconnecting the one or more LRT ports of the single handheld monitoring system from the system(s), connecting one or more network analysis ports of the single handheld monitoring system to the system(s), conducting a network analysis of the system (s) with the single handheld monitoring system, disconnecting the one or more network analysis ports of the single handheld monitoring system from the system(s), connecting one or more time domain reflectometer (TDR) ports of the single handheld monitoring system to the system(s), conducting time domain reflectometry of the system(s) with the single handheld monitoring system, and disconnecting the one or more TDR ports of the single handheld monitoring system from the system(s). The method may also include wirelessly transmitting data related to the LRT, the network analysis, and the time domain reflectometry from the single handheld system to a separate and distinct computing device. The method may also include processing the data with the separate and distinct computing device. Further, the method may include transmitting software updates from the separate and computing device to the single handheld monitoring system.

Embodiments of the present disclosure provide electrical monitoring systems that are significantly reduced in size compared to prior loop resistance testers. Embodiments of the present disclosure reduce maintenance costs. Data processing may be performed in a remote computing device, which allows the electrical monitoring systems to be more compact, and offer increased functional possibilities.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. An electrical monitoring system configured to monitor one or more systems of a vehicle, the electrical monitoring system comprising:
    a housing;
    a loop resistance test (LRT) unit contained within the housing, wherein the LRT unit is configured to conduct loop resistance tests with respect to the one or more systems of the vehicle; and
    a network analyzer contained within the housing, wherein the network analyzer is configured to conduct network analysis with respect to the one or more systems of the vehicle,
    wherein the LRT unit is configured to acquire LRT test data regarding the loop resistance tests, and wherein the network analyzer uses the LRT test data acquired by the LRT unit to identify electrical characteristics of the one or more systems.

2. The electrical monitoring system of claim 1, further comprising:
    one or more LRT ports extending into or from the housing, wherein the one or more LRT ports are coupled to the LRT unit and configured to connect to the one or more systems of the vehicle; and
    one or more network analyzer ports extending into or from the housing, wherein the one or more network analyzer ports are coupled to the network analyzer and configured to connect to the one or more systems of the vehicle.

3. The electrical monitoring system of claim 2, wherein the one or more LRT ports comprise a sense coupler, a drive coupler, and at least one joint probe.

4. The electrical monitoring system of claim 2, wherein the one or more LRT ports are incompatible with the network analyzer, and wherein the one or more network analyzer ports are incompatible with the LRT unit.

5. The electrical monitoring system of claim 1, further comprising a time domain reflectometer (TDR) unit contained within the housing, wherein the TDR unit is configured to conduct time domain reflectometry with respect to the one more systems of the vehicle, wherein the LRT, the network analyzer, and the TDR unit are controlled and coordinated by a remote computing device that is separate and distinct from the housing.

6. The electrical monitoring system of claim 5, further comprising one or more TDR ports extending into or from the housing, wherein the one or more TDR ports are coupled to the TDR unit and configured to connect to the one or more systems of the vehicle.

7. The electrical monitoring system of claim 6, wherein the one or more TDR ports are incompatible with the LRT unit and the network analyzer.

8. The electrical monitoring system of claim 1, further comprising a communication unit configured to allow communication between the electrical monitoring system and a remote computing device.

9. The electrical monitoring system of claim 8, wherein the remote computing device is configured to process data obtained by one or both of the LRT unit and the network analyzer.

10. The electrical monitoring system of claim 8, wherein the LRT unit and the network analyzer receive software updates from the remote computing device through the communication unit, wherein the remote computing device is configured to update software that controls operation of each of the LRT unit and the network analyzer.

11. The electrical monitoring system of claim 1, wherein the housing comprises a plurality of docks configured to removably retain a plurality of unit modules, wherein the plurality of unit modules includes an LRT unit module that includes the LRT unit and a network analyzer module that includes the network analyzer, wherein the LRT module and the network analyzer module are each configured to be selectively connected and disconnected from the plurality of docks, wherein the plurality of docks are configured to receive at least one additional test module to provide additional operational capability, and wherein each of the plurality of unit modules are interchangeably connectable to the housing.

12. The electrical monitoring system of claim 1, wherein the housing provides a display that is configured to present information related to the loop resistance tests and the network analysis.

13. A method of monitoring one or more systems of a vehicle, the method comprising:
    connecting one or more loop resistance test (LRT) ports of a single handheld monitoring system to the one or more systems;
    conducting a LRT of the one or more systems with the single handheld monitoring system;
    disconnecting the one or more LRT ports of the single handheld monitoring system from the one or more systems;
    connecting one or more network analysis ports of the single handheld monitoring system to the one or more systems;

conducting a network analysis of the one or more systems with the single handheld monitoring system;

disconnecting the one or more network analysis ports of the single handheld monitoring system from the one or more systems;

connecting one or more time domain reflectometer (TDR) ports of the single handheld monitoring system to the one or more systems;

conducting time domain reflectometry of the one or more systems with the single handheld monitoring system;

disconnecting the one or more TDR ports of the single handheld monitoring system from the one or more systems, wherein the conducting the network analysis comprises analyzing results of the LRT, wherein the analyzing the results of the LRT comprises using the LRT to identify electrical characteristics of the one or more systems.

14. The method of claim 13, further comprising: controlling and coordinating the LRT, the network analyzer, and the time domain reflectometry with a computing device that is separate and distinct from the single handheld monitoring system; and wirelessly transmitting data related to the LRT, the network analysis, and the time domain reflectometry from the single handheld monitoring system to the computing device.

15. The method of claim 13, further comprising processing the data with a computing device that is separate and distinct from the single handheld monitoring system.

16. The method of claim 13, further comprising: transmitting software updates from a computing device to the single handheld monitoring system; and using the software updates transmitted from the computing device to update software that controls the LRT, the network analysis, and the time domain reflectometry.

17. An electrical monitoring system configured to monitor one or more systems of a vehicle, the electrical monitoring system comprising:

a single handheld housing;

a loop resistance test (LRT) unit contained within the housing, wherein the LRT unit is configured to conduct loop resistance tests with respect to the one or more systems of the vehicle;

one or more LRT ports extending into or from the housing, wherein the one or more LRT ports are coupled to the LRT unit and configured to connect to the one or more systems of the vehicle;

a network analyzer contained within the housing, wherein the network analyzer is configured to conduct network analysis with respect to the one or more systems of the vehicle;

one or more network analyzer ports extending into or from the housing, wherein the one or more network analyzer ports are coupled to the network analyzer and configured to connect to the one or more systems of the vehicle;

a time domain reflectometer (TDR) unit contained within the housing, wherein the TDR unit is configured to conduct time domain reflectometry with respect to the one more systems of the vehicle;

one or more TDR ports extending into or from the housing, wherein the one or more TDR ports are coupled to the TDR unit and configured to connect to the one or more systems of the vehicle;

a communication unit configured to allow communication between the electrical monitoring system and a remote computing device that is separate and distinct from the single handheld housing; and a display retained by the housing, wherein the display is configured to present information related to the loop resistance tests, the network analysis, and the time domain reflectometry, wherein the LRT unit is configured to acquire LRT test data regarding the loop resistance tests, and wherein the network analyzer uses the LRT test data acquired by the LRT unit to identify electrical characteristics of the one or more systems.

18. The electrical monitoring system of claim 17, wherein the one or more LRT ports are incompatible with the network analyzer and the TDR unit, wherein the one or more network analyzer ports are incompatible with the LRT unit and the TDR unit, and wherein the one or more TDR ports are incompatible with the LRT unit and the network analyzer.

19. The electrical monitoring system of claim 17, wherein the remote computing device is configured to process data obtained by one or both of the LRT unit and the network analyzer, and wherein the LRT unit, the network analyzer, and the TDR unit receive software updates from the remote computing device through the communication unit, wherein the software updates received from the remote computing device update software that controls operation of each of the LRT unit, the network analyzer, and the TDR unit.

20. The electrical monitoring system of claim 17, wherein the housing comprises a plurality of docks configured to removably retain a plurality of unit modules, wherein the plurality of unit modules includes an LRT unit module that includes the LRT unit, a network analyzer module that includes the network analyzer, and a TDR module that includes the TDR unit, wherein the LRT module, the network analyzer module, and the TDR module are each configured to be selectively connected and disconnected from the plurality of docks, wherein the plurality of docks are configured to receive at least one additional test module to provide additional operational capability, and wherein each of the plurality of unit modules are interchangeably connectable to the housing.

* * * * *